(12) United States Patent
Wang et al.

(10) Patent No.: US 9,363,932 B2
(45) Date of Patent: *Jun. 7, 2016

(54) INTEGRATED GRAPHENE FILM HEAT SPREADER FOR DISPLAY DEVICES

(75) Inventors: Mingchao Wang, Fairborn, OH (US); Wei Xiong, Kettering, OH (US); Aruna Zhamu, Centerville, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 1032 days.

This patent is subject to a terminal disclaimer.

(21) Appl. No.: 13/507,167

(22) Filed: Jun. 11, 2012

(65) Prior Publication Data

US 2013/0329366 A1    Dec. 12, 2013

(51) Int. Cl.
| | |
|---|---|
| B32B 9/00 | (2006.01) |
| H05K 7/20 | (2006.01) |
| F28D 7/02 | (2006.01) |
| B82Y 30/00 | (2011.01) |

(52) U.S. Cl.
CPC ............. *H05K 7/20963* (2013.01); *B82Y 30/00* (2013.01)

(58) Field of Classification Search
CPC ............. Y10T 428/30; C01B 31/0438; H05K 7/20963; C09K 5/14; B82Y 30/00
USPC ............................ 165/185; 428/408; 361/709
See application file for complete search history.

(56) References Cited

U.S. PATENT DOCUMENTS

| | | | |
|---|---|---|---|
| 3,404,061 A | 10/1968 | Shane et al. | |
| 5,831,374 A | 11/1998 | Morita et al. | |
| 7,071,258 B1 | 7/2006 | Jang et al. | |
| 7,138,029 B2 | 11/2006 | Norley et al. | |
| 7,150,914 B2 | 12/2006 | Clovesko et al. | |
| 7,160,619 B2 | 1/2007 | Clovesko et al. | |
| 7,306,847 B2 | 12/2007 | Capp et al. | |
| 7,385,819 B1 | 6/2008 | Shives et al. | |
| 2010/0000441 A1* | 1/2010 | Jang et al. .................. | 106/31.13 |
| 2010/0055025 A1* | 3/2010 | Jang ....................... | B82Y 30/00 423/448 |
| 2010/0085713 A1 | 4/2010 | Balandin et al. | |
| 2010/0128439 A1* | 5/2010 | Tilak et al. .................... | 361/709 |
| 2010/0140792 A1 | 6/2010 | Haddon et al. | |
| 2011/0108978 A1 | 5/2011 | Kim et al. | |
| 2011/0159372 A1* | 6/2011 | Zhamu et al. ................. | 429/232 |

OTHER PUBLICATIONS

Xu et al. ("Self-Assembled Graphene Hydrogel via a One-Step Hydrothermal Process" ACS nano, 2010, 4, p. 4324-4330).*
Cheng et al. ("The reduction of graphene oxide" Carbon, 50, 2012, p. 3210-3228).*
Gong et al. ("Graphitization of Graphene Oxide with Ethanol during Thermal Reduction" J. Chem. Phys. C, 2012, 116, p. 9969-9979 (published Apr. 2012)).*
U.S. Appl. No. 10/858,814, filed Jun. 3, 2004, B. Z. Jang, et al.
U.S. Appl. No. 11/509,424, filed Aug. 25, 2006, B. Z. Jang, et al.
U.S. Appl. No. 11/784,606, filed Apr. 9, 2007, A. Zhamu, et al.
U.S. Appl. No. 13/385,813, filed Mar. 8, 2012, A. Zhamu, et al.
U.S. Appl. No. 13/506,265, filed Apr. 9, 2012, A. Zhamu, et al.

* cited by examiner

*Primary Examiner* — Prashant J Khatri
*Assistant Examiner* — Travis Figg

(57) ABSTRACT

Disclosed is an integrated graphene film-enhanced display device, comprising: (a) a display device which comprises one or multiple heat sources and a back surface where a localized area is at a higher temperature than an adjacent area; and (b) a heat spreader which comprises at least one sheet of integrated graphene film having two major surfaces, wherein one of the major surfaces of the heat spreader is in thermal contact with one or multiple heat sources and further wherein the heat spreader itself reduces the temperature difference between locations on the display device. The integrated graphene film, either a graphene film obtained from a graphene oxide gel or a graphene composite film formed of graphene oxide gel-bonded nano graphene platelets (NGPs), exhibits highest thermal conductivity and highest effectiveness in reducing hot spots in various kinds of display devices.

35 Claims, 8 Drawing Sheets

INTEGRATED GRAPHENE FILM HEAT SPREADER FOR DISPLAY DEVICES

This invention is based on the results of a research project sponsored by the US National Science Foundation SBIR-STIR Program.

The present invention claims the benefits of the following co-pending patent applications:
1. A. Zhamu, et al., "Graphene Oxide Gel Bonded Graphene Composite Films and Processes for Producing Same," U.S. patent application Ser. No. 13/385,813 (Mar. 8, 2012).
2. A. Zhamu, et al., "Thermal Management System Containing an Integrated Graphene Film for Electronic Devices," U.S. patent application Ser. No. 13/506,265 (Apr. 9, 2012).

FIELD OF THE INVENTION

The present invention relates generally to the field of graphene materials for heat dissipation applications, and more particularly to integrated graphene films and graphene-graphene oxide composite films with an exceptionally high thermal conductivity, high electrical conductivity, and high mechanical strength for display device applications. The display device includes a plasma display panel (PDP), a liquid crystal display (LCD), a light emitting diode (LED), and the like.

BACKGROUND OF THE INVENTION

Carbon is known to have five unique crystalline structures, including diamond, fullerene (0-D nano graphitic material), carbon nano-tube (1-D nano graphitic material), graphene (2-D nano graphitic material), and graphite (3-D graphitic material). These are five fundamentally different and distinct classes of materials.

The carbon nano-tube (CNT) refers to a tubular structure grown with a single wall or multi-wall, which can be conceptually obtained by rolling up a graphene sheet or several graphene sheets to form a concentric hollow structure. Carbon nano-tubes have a diameter on the order of a few nanometers to a few hundred nanometers. Its longitudinal, hollow structure imparts unique mechanical, electrical and chemical properties to the material.

A graphene plane in a graphite crystal is composed of carbon atoms occupying a two-dimensional hexagonal lattice. The constituent graphene planes can be extracted or isolated from a graphite crystal to form individual graphene sheets. An isolated, individual graphene sheet is commonly referred to as single-layer graphene. A stack of multiple graphene planes bonded through van der Waals forces in the thickness direction is commonly referred to as a multi-layer graphene, typically having 2-300 layers or graphene planes, but more typically 2-100 graphene planes. Single-layer graphene and multi-layer graphene sheets are collectively called "nano-scaled graphene platelets" (NGPs). Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted in October 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

NGPs are typically obtained by intercalating natural graphite flakes with a strong acid and/or oxidizing agent to obtain a graphite intercalation compound (GIC) or graphite oxide, as illustrated in FIG. 1. This is most often accomplished by immersing natural graphite flakes in a mixture of sulfuric acid, nitric acid (an oxidizing agent), and another oxidizing agent (e.g. potassium permanganate or sodium chlorate). The resulting GIC is actually some type of graphite oxide particles. This GIC is then repeatedly washed and rinsed in water to remove excess acids, resulting in a graphite oxide suspension or dispersion which contains discrete and visually discernible graphite oxide particles dispersed in water. There are two processing routes to follow after this rinsing step:

Route 1 involves removing water from the suspension to obtain "expandable graphite," which is essentially dried GIC or dried graphite oxide particles. Upon exposure of expandable graphite to a temperature in the range of 800-1,050° C. for approximately 30 seconds to 2 minutes, the GIC expands by a factor of 30-300 to form a "graphite worm," which is a collection of exfoliated, but largely un-separated or interconnected graphite flakes. In Route 1A, these graphite worms (exfoliated graphite or "networks of interconnected/non-separated graphite flakes") can be re-compressed to obtain flexible graphite sheets that typically have a thickness in the range of 0.125 mm (125 μm)-0.5 mm (500 μm).

In Route 1B, the exfoliated graphite is subjected to mechanical shearing (e.g. using an ultrasonicator, high-shear mixer, air jet mill, or ball mill) to form separated single-layer and multi-layer graphene sheets (collectively, NGPs), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is preferably less than 20 nm.

Route 2 entails ultrasonicating the graphite oxide suspension for the purpose of separating individual graphene oxide sheets from graphite oxide particles. This is based on the notion that the inter-graphene plane separation has been increased from 0.335 nm in natural graphite to 0.6-1.1 nm in highly oxidized graphite oxide, significantly weakening the van der Waals forces that hold neighboring planes together. Ultrasonic power can be sufficient to further separate graphene plane sheets to form separate, isolated, or discrete graphene oxide (GO) sheets having a typical oxygen content of 5-47% by weight (more typically 20-47%). These graphene oxide sheets can then be chemically or thermally reduced to obtain "reduced graphene oxides" (RGO) typically having an oxygen content of 1-5% by weight, more typically <2% by weight.

For the purpose of defining the claims of the instant application, NGPs include single-layer and multi-layer graphene or reduced graphene oxide with an oxygen content of 0-5% by weight, more typically and preferably 0-2% weight. Pristine graphene has essentially 0% oxygen. In contrast, graphene oxide (GO) sheets, without reduction, have a typical oxygen content of 5-47% by weight (more typically 5-40%). Optionally, but preferably, GO sheets are originally in a gel form and, during or after merging with one another or with graphene sheets (NGP), the oxygen content can be reduced to less than 5%.

The present invention is directed at addressing unique thermal issues associated with a display device, such as a plasma display panel (PDP), a liquid crystal display (LCD), a light emitting diode (LED), and the like. These issues cannot be effectively addressed by current heat spreader materials, such as flexible graphite and the so-called "high-orientation graphite."

A plasma display panel is a display device which contains multiple discharge cells, and is constructed to display an image by applying a voltage across electrodes of discharge cells thereby causing the desired discharge cell to emit light. A panel unit, which is the main part of a plasma display panel, is fabricated by bonding two glass base plates together in such a manner as to sandwich multiple discharge cells between them.

In a plasma display panel, each of the discharge cells which are caused to emit light for image formation generates heat. Thus, each cell is a heat source, which increases the temperature of other internal components and also causes the temperature of the plasma display panel as a whole to rise. The heat generated in the discharge cells is transferred to the glass that forms the base plates. However, it is difficult to conduct heat in the directions parallel to the panel face due to the low thermal conductivity of the glass base plate material.

Additionally, the temperature of a discharge cell which has been activated for light emission rises significantly, but the temperature of a discharge cell which has not been activated does not rise as much. Consequently, the panel face temperature rises locally in the areas where an image is being generated. Further, a discharge cell activated in the white or lighter color spectra generate more heat than those activated in the black or darker color spectra. Hence, the temperature of the panel face is different locally, depending on the colors generated in creating the image. Unless proper measures are taken to reduce these localized temperature differentials, they can accelerate thermal deterioration of affected discharge cells.

Because the temperature difference between activated and non-activated discharge cells can be high, and the temperature difference between discharge cells generating white light and those generating darker colors also can be high, a thermal stress is induced in the panel unit, causing the plasma display panel to develop thermal stress-induced cracks.

Furthermore, when the voltage applied to the discharge cell electrodes is increased, the brightness of the discharge cells increases and the amount of heat generated in such cells also increases. Hence, those cells having large voltages for activation become more susceptible to thermal deterioration and tend to exacerbate the cracking problem of the panel unit of the plasma display panel.

LEDs present similar issues with respect to heat generation as do plasma display panels. Similar issues arise in display devices other than emissive display devices, such as LCDs and LEDs, where hot spots can reduce the effectiveness or life of the device.

The use of so-called "high orientation graphite film" as thermal interface materials for plasma display panels to fill the space between the back of the panel and a heat sinking unit and to even out local temperature differences is suggested by Morita, et al in U.S. Pat. No. 5,831,374. The high orientation graphite used in the invention is highly crystalline graphite with graphite crystals oriented substantially in one direction. This graphite material is made by depositing overlapping layers of carbon atoms using a hydrocarbon-based source gas (also called CVD method), and then annealing the resulting structure. The high-orientation graphite may also be produced by carbonizing and then graphitizing a polymer compound at high temperatures (up to 3,200° C.). The precursor polymer compound may be selected from polyoxadiazoles (POD), polybenzothiazole (PBT), polybenzo-bis-thiazole (PBBT), polybenzooxazole (PBO), polybenzo-bis-oxazole (PBBO), polyimides (PI), polyamides (PA), polyphenylene-benzoimidazole (PBI), polyphenylene-benzo-bisimidazole (PPBI), polythiazole (PT), and polyparaphenylene-vinylene (PPV). This is a slow, tedious, energy-intensive, and high-cost process. Furthermore, Carbonization of certain polymers (e.g. polyacrylonitrile) involves the emission of toxic species.

In addition, U.S. Pat. No. 7,138,029, U.S. Pat. No. 7,150,914, U.S. Pat. No. 7,160,619, U.S. Pat. No. 7,276,273, U.S. Pat. No. 7,306,847, and U.S. Pat. No. 7,385,819 disclose the use of flexible graphite sheets (referred to as "sheets of compressed particles of exfoliated natural graphite" in these patents) as heat spreaders for a display panels. In these patents, the flexible graphite sheets are made by the compression of exfoliated graphite or graphite worms. The fabrication methods of exfoliated graphite have been well known and documented through numerous patents and technical publications. Briefly, the exfoliated graphite is re-compressed by using a calendering or roll-pressing technique to obtain flexible graphite sheets or foils, which are typically much thicker than 100 µm. It seems that no flexible graphite sheet thinner than 75 µm has ever been reported in the open literature or patent documents. Commercially available flexible graphite sheets normally have a thickness greater than 0.125 mm (125 µm), an in-plane electrical conductivity of $1-3\times10^3$ S/cm, through-plane (thickness-direction) electrical conductivity of 5-30 S/cm, in-plane thermal conductivity of 140-300 W/(mK), and through-plane thermal conductivity of approximately 5 W/(mK).

Flexible graphite sheets (obtained by re-compression of exfoliated graphite or graphite worms) for thermal management applications generally have the following major deficiencies:

(1) As indicated earlier, flexible graphite (FG) sheets exhibit a relatively low thermal conductivity, typically <500 W/mK and more typically <300 W/mK.

(2) Flexible graphite sheets are also of low strength and poor structural integrity. The high tendency for flexible graphite sheets to get torn apart makes them difficult to handle in the process of integrating them in a microelectronic device.

(3) Another very subtle, previously ignored or overlooked, but critically important feature of FG sheets is their high tendency to get flaky with graphite flakes easily coming off FG sheet surfaces and emitting out to other parts of a microelectronic device or display device. These highly electrically conducting flakes (typically 1-500 µm in lateral dimensions and >100 nm in thickness) can cause internal shorting and failure of electronic devices.

(4) In order to prevent the flaking of graphite particles, it becomes necessary to apply a protective coating onto a flexible graphite sheet, adding manufacturing complexity and cost to the heat spreader products and compromising the overall heat dissipation capability due to the extremely low thermal conductivity of the resin coating.

(5) The surface roughness of flexible graphite sheet is too large (about 500 nm) to form good contact with the display panel back. The real contact area is very small and therefore the thermal interface transfer efficiency is low.

Similarly, the NGPs, when packed into a film or paper sheet of non-woven aggregates, exhibit a thermal conductivity higher than 1,000 W/mK only when the film or paper is cast and pressed into a sheet having a thickness lower than 10 µm. Further, the thermal conductivity is higher than 1,500 W/mK only when the film or paper is cast and pressed into a sheet having a thickness lower than 1 µm. This is reported in our earlier U.S. patent application Ser. No. 11/784,606 (Apr. 9, 2007). However, ultra-thin film or paper sheets (<10 µm) are difficult to produce in mass quantities, and difficult to handle when one tries to incorporate these thin films as a heat spreader material during the manufacturing process. Further, thickness dependence of thermal conductivity (not being able to achieve a high thermal conductivity at a wide range of film thicknesses) is not a desirable feature. Non-woven aggregates of NGPs (graphene sheets or platelets) also have a tendency to get flaky.

Our earlier application (U.S. application Ser. No. 11/784, 606) further disclosed a mat, film, or paper of NGPs infiltrated with a metal, glass, ceramic, resin, and CVD graphite matrix material. Later on, Haddon, et al (US Pub. No. 2010/0140792, Jun. 10, 2010) also reported NGP thin film and NGP-polymer composites for thermal management applications. The processes used by Haddon et al to produce NGPs are identical to those disclosed much earlier by us (Jang, et al. U.S. patent application Ser. No. 10/858,814 (Jun. 3, 2004)). The NGP-polymer composites, as an intended thermal interface material, have very low thermal conductivity, typically <<2 W/mK, even though Haddon et al claim to have improved the thermal conductivity of epoxy by up to 3000%. The NGP films of Haddon, et al are essentially non-woven aggregates of graphene platelets, identical to those of our earlier invention (U.S. application Ser. No. 11/784,606). These aggregates have a great tendency to have graphite particles flaking from and separated from the film surface, creating internal shorting problem for the electronic device containing these aggregates. They also exhibit low thermal conductivity unless made into thin films (10 nm-300 nm, as reported by Haddon, et al) which are then very difficult to handle in a real device manufacturing environment. Balandin, et al (US Pub. No. 2010/0085713, Apr. 8, 2010) also disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal matrix infiltrated NGPs. However, metal matrix material is too heavy and the resulting metal matrix composite does not exhibit a high thermal conductivity.

Another prior art material for thermal management application is the pyrolitic graphite film. The lower portion of FIG. 1 illustrates a process for producing prior art pyrolitic graphitic films or sheets. The process begins with carbonizing a polymer 46 at a carbonization temperature of 500-1,000° C. for 2-10 hours to obtain a carbonized material 48, which is followed by a graphitization treatment at 2,500-3,200° C. for 5-24 hours to form a graphitic film 50. This is a slow, tedious, and energy-intensive process. Carbonization of certain polymers (e.g. polyacrylonitrile) involves the emission of toxic species.

Thus, it is an object of the present invention to provide a highly thermally conductive composite thin film (composed of graphene oxide gel-bonded graphene sheets, also herein referred to as "GO gel-bonded NGPs" or "GO-bonded NGPs") that can be used for thermal management applications (e.g. for use as a heat spreader) in a display device.

It is a particular object of the present invention to provide a highly conductive integrated graphene film (obtained by heat-treating graphene oxide gel to merge graphene oxide sheets in an edge-to-edge manner) and GO gel-bonded NGP composite thin-film structure that exhibits a thermal conductivity greater than 600 W/mK, typically greater than 800 W/mK, more typically greater than 1,500 W/mK (even when the film thickness is greater than 10 µm), and most preferably and often greater than 1,700 W/mK.

It is another object of the present invention to provide an integrated graphene film sheet that exhibits a relatively thickness-independent thermal conductivity.

Still another object of the present invention is to provide a GO-bonded pristine graphene composite thin film that exhibits exceptional thermal and electrical conductivity properties.

It is a further object of the present invention to provide an NGP-GO composite thin-film sheet that is lightweight and exhibits a relatively high strength or structural integrity.

It is yet another object of the present invention to provide a highly conductive NGP-GO composite thin-film sheet (and related processes) wherein the in-plane thermal conductivity is greater than 600 W/mK (preferably and typically greater than 1,000 W/mK) and in plane electrical conductivity is greater than 2,000 S/cm (preferably and typically >3,000 S/cm), and/or a tensile strength greater than 10 MPa (preferably and typically >40 MPa).

SUMMARY OF THE INVENTION

The present invention provides an integrated graphene film-based display device, comprising: (a) a display device which comprises a plurality of heat sources and a back surface where a localized region of higher temperature is generated; and (b) a heat spreader which comprises at least one sheet of integrated graphene film having two major surfaces, wherein one of the major surfaces of the heat spreader is in thermal contact with one or a plurality of the heat sources and further wherein the heat spreader itself reduces the temperature difference between locations on the display device. The integrated graphene film, either a graphene film obtained from a graphene oxide gel or a graphene composite film formed of graphene oxide gel-bonded nano graphene platelets (NGPs), exhibits highest thermal conductivity and effectiveness in reducing hot spots in various kinds of display devices. This GO gel may be advantageously reduced to partially or completely remove oxygen and other non-carbon atoms from the original GO structure, further increasing the thermal and electrical conductivity.

The graphene composite thin film may be composed of nano graphene platelets (NGPs) bonded by a graphene oxide binder. There is no other resin binder or matrix material involved or included in this graphene composite. In other words, there is no polymer matrix, metal matrix, ceramic matrix, glass matrix, or carbon matrix involved. The only binder or matrix material used is graphene oxide, which is chemically converted from the original form of a graphene oxide gel and which can be chemically or thermally reduced to various desired extents.

The NGPs contain single-layer graphene or multi-layer graphene sheets having a thickness from 0.335 nm to 100 nm, and the NGPs occupy a weight fraction of 1% to 99.9% of the total composite weight. The graphene oxide binder, having an oxygen content of 1-40% by weight based on the total graphene oxide weight, occupies a weight fraction of 0.1% to 99% of the total composite weight. The composite forms a thin film with a thickness no greater than 1 mm, preferably thinner than 200 µm, and further preferably not greater than 100 µm. The film thickness is preferably thicker than 10 µm, but can be thinner. The multi-layer graphene sheets typically and preferably have a thickness of 3.35 nm to 33.5 nm and the film has a thickness preferably between 10 and 100 µm.

Preferably, the graphene oxide binder has an oxygen content of 1-5% by weight based on the total graphene oxide weight even though the original graphene oxide gel may have a much higher oxygen content. The graphene oxide binder preferably occupies a weight fraction of 1% to 40% of the total composite weight. The graphene oxide may be obtained from a graphene oxide gel. This gel is obtained by immersing a graphitic material in a powder or fibrous form in a strong oxidizing liquid in a reaction vessel at a reaction temperature for a length of time sufficient to obtain a graphene oxide gel. This graphene oxide gel has the characteristics that it is optically transparent or translucent and visually homogeneous with no discernible discrete graphene or graphene oxide sheets dispersed therein. In contrast, conventional suspension of discrete graphene or graphene oxide sheets, or graphite flakes in water, acid, or solvent looks opaque, dark, black or heavy brown in color with individual graphene, graphene oxide sheets, or graphite flakes being discernible or recognizable with naked eyes.

The graphene oxide molecules as part of a graphene oxide gel are aromatic chains that have an average number of benzene rings in the chain typically less than 1000, more typically less than 500, and most typically less than 100. Most of the molecules have more than 5 or 6 benzene rings (mostly >10 benzene rings) from combined atomic force microscopy, high-resolution TEM, and molecular weight measurements. These benzene-ring type of aromatic molecules have been heavily oxidized and contain functional groups, such as —COOH and —OH and, therefore, are "soluble" (not just dispersible) in polar solvents, such as water. Due to the high concentration of these functional groups, the refraction index of these aromatic ring structures is likely comparable to that of the dispersing medium.

These soluble molecules behave like polymers and are surprisingly capable of serving as a binder or adhesive that bonds NGPs together to form a composite thin film of good structural integrity, high thermal conductivity, and high electrical conductivity. Conventional discrete graphene or graphene oxide sheets (not in a gel form) do not have any binding or adhesion power.

A preferred embodiment of the present invention is a heat-dissipating system that contains an integrated graphene film that is produced by casting a graphene oxide gel into a thin film form and then removing the liquid component of the gel. The material is then subjected to a heat treatment at a temperature of 100-3,200° C. (more preferably 300-1,500° C.), allowing individual graphene oxide molecules to link up or merge with one another into an essentially unitary entity (as opposed just a simple aggregate of individual graphene sheets). The resulting integrated graphene film is a single-grain or few-grain graphene sheet that has no or few sheet-to-sheet grain boundaries.

Another preferred embodiment of the present invention is a heat-dissipating system featuring a graphene composite thin film in combination with a display device. The composite film is obtained by mixing NGPs in a graphene oxide gel to form a NGP-graphene oxide gel mixture suspension, making the suspension into a thin film form, and removing the residual liquid from the mixture suspension preferably with the assistance of heat. The resulting composite is composed of NGPs that are bonded by a graphene oxide binder to form an essentially pore-free film or an integral film of low porosity level (having a physical density greater than 1.6 g/cm$^3$, more typically >1.8 g/cm$^3$, and often >2.0 g/cm$^3$, approaching the theoretical density (2.25 g/cm$^3$) of perfect graphene sheets.

The graphene oxide binder is made from a graphene oxide gel obtained by dissolving a graphitic material in a fluid containing a strong oxidizing agent at a desired temperature for a length of time sufficient to form a gel. The starting graphitic material for making graphene oxide gel may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The NGPs may also be produced from a graphitic material selected from natural graphite, artificial graphite, meso-phase carbon, meso-phase pitch, meso-carbon micro-beads, soft carbon, hard carbon, coke, carbon fiber, carbon nano-fiber, carbon nano-tube, or a combination thereof.

The present invention further provides a graphene composite composition composed of nano graphene platelets (NGPs) bonded by a graphene oxide binder obtained from a graphene oxide gel, wherein the NGPs contain single-layer graphene or multi-layer graphene sheets having a thickness from 0.335 nm to 100 nm, and the NGPs occupy a weight fraction of 1% to 99.9% of the total composite weight. The graphene oxide binder, having an oxygen content of 0.1%-40% by weight based on the total graphene oxide weight, occupies a weight fraction of 0.1% to 99% of the total composite weight. After a heat treatment, the oxygen content of the GO binder can be reduced to <10% (e.g. 300° C. for 2 hours), <5% (800° C. for 2 hours), <2% (1,200° C. for 3 hours), or <1% (1500° C. for 2 hours). This composite composition is a particularly effective heat spreader component in an electronic device or display device.

The light weight (lower density compared to metal and ceramic materials), exceptional thermal conductivity, relatively high structural integrity, and no tendency to flake or emit graphite or graphene particles into open air make the invented integrated graphene film and graphene oxide bonded NGP composite an ideal thermal management material for portable electronic devices and display apparatus. Since the graphene film or composite film is essentially a unitary entity containing one or few grains, there is no graphene sheet or graphite flake to be "flaked off" from. Further, the integrated graphene film has an electrical conductivity typically greater than 3,000 S/cm and a thermal conductivity greater than 1,000 W/mK. In some cases, the integrated graphene film has an electrical conductivity greater than 1,500 S/cm, a thermal conductivity greater than 600 Wm$^{-1}$K$^{-1}$, a physical density greater than 1.4 g/cm3, and a tensile strength greater than 10 MPa. More typically, the integrated graphene film has an electrical conductivity greater than 2,000 S/cm, a thermal conductivity greater than 800 W/mK, a physical density greater than 1.8 g/cm3, and a tensile strength greater than 40 MPa. Even more typically and desirably, the integrated graphene film has an electrical conductivity greater than 3,000 S/cm, a thermal conductivity greater than 1,500 W/mK, a physical density greater than 2.0 g/cm$^3$, and a tensile strength greater than 40 MPa.

The present invention also provides a heat-dissipating system (for display devices) that contains an integrated graphene film produced from a graphene oxide gel, which gel is prepared by immersing a graphitic material in a powder or fibrous form in an oxidizing liquid to form an optically opaque suspension in a reaction vessel at a reaction temperature for a length of time sufficient to obtain a graphene oxide gel that is optically transparent or translucent, wherein the graphene oxide gel is composed of graphene oxide molecules dispersed in an acidic medium having a pH value of no higher than 5 and said graphene oxide molecules have an oxygen content no less than 20% by weight.

The integrated graphene film can be a film produced from a graphene oxide gel, which is prepared by immersing a graphitic material in an oxidizing agent to form an optically opaque suspension and allowing an oxidizing reaction to proceed until an optically transparent or translucent solution is formed, and wherein the graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

In a preferred embodiment of the present invention, a thermal transfer material is positioned between the heat-conducting graphene layer and the display panel. The thermal transfer material comprises a metal or a thermal interface material, which can be selected from a thermal grease containing graphene sheets, thermally conductive rubber, thermally conductive resin, thermally conductive soft material, etc.

The implementation of an integrated graphene film-based heat-dissipating provision was found to significantly reduce or eliminate several heat-induced device malfunction or poor function issues. For instance, a plasma display device featuring an integrated graphene film as a heat spreader was found to reduce a surface temperature by as much as 12 degrees Celsius after a continuous use of the device for an extended period of time. In contrast, the use of a commercially available flexible graphite sheet from Graftech (associated with Advanced Energy Technology, Inc.) helps to reduce the temperature by only 3 degrees.

DESCRIPTION OF THE PREFERRED EMBODIMENTS

Figure 1:
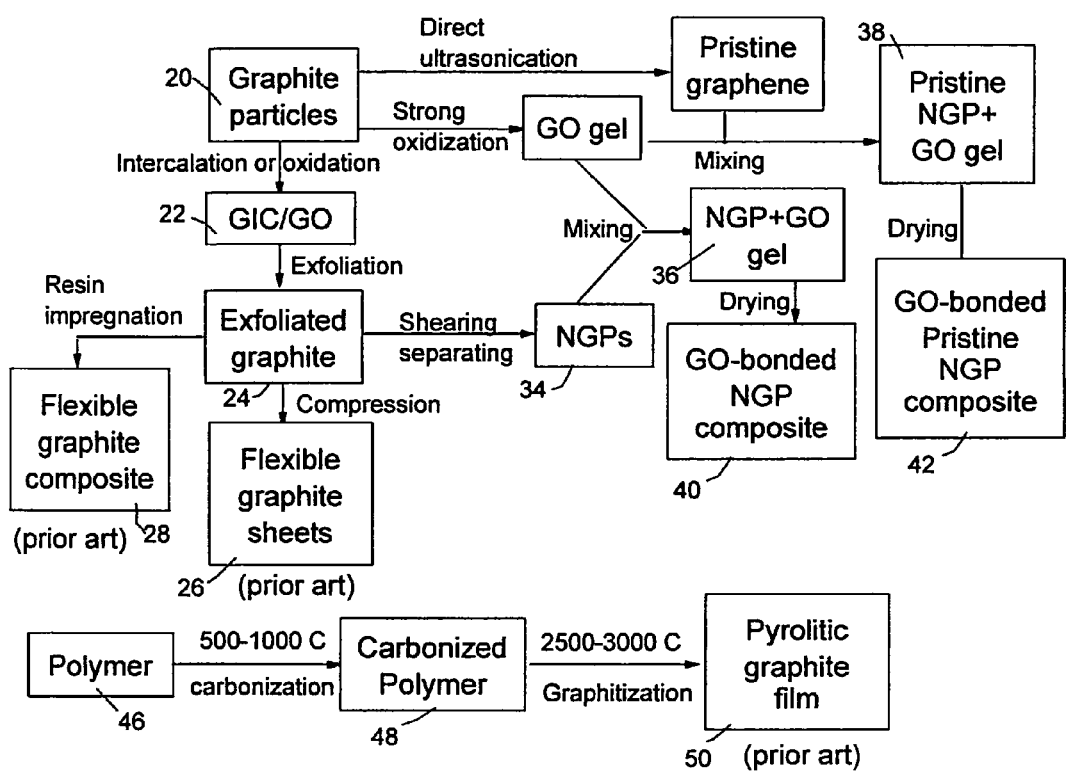
FIG. 1 A flow chart illustrating various prior art processes of producing exfoliated graphite products (flexible graphite sheets and flexible graphite composites) and pyrolytic graphite films, along with presently invented processes of producing a graphene oxide gel-bonded NGP composite.
Figure 2A:
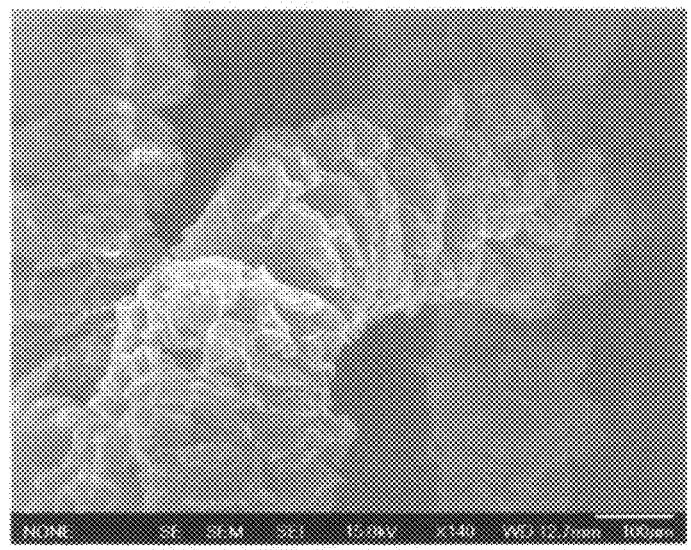
FIG. 2 (a) A SEM image of a graphite worm sample after exfoliation of graphite intercalation compounds (GICs); (b) An SEM image of a cross-section of a flexible graphite sheet, showing many graphite flakes with orientations not parallel to the flexible graphite sheet surface and many defect structures.
Figure 2B:
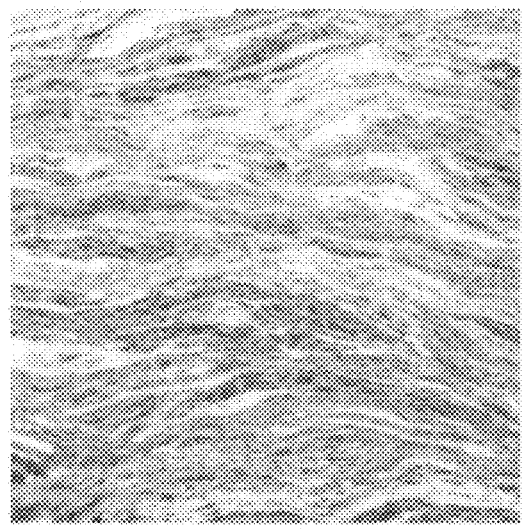

The present invention provides an integrated graphene film-based display device, comprising: (a) a display device which comprises a plurality of heat sources and a back surface where a localized region of higher temperature is generated; and (b) a heat spreader which comprises at least one sheet of integrated graphene film having two major surfaces, wherein one of the major surfaces of the heat spreader is in thermal contact with one or a plurality of the heat sources and further wherein the heat spreader itself reduces the temperature difference between locations on the display device. The heat spreader comprises at least one sheet of integrated graphene film which effectively dissipates heat and thermally shields the external surface or the second component of the display device from heat generated by heat sources. The second component can be any functional circuit component that is heat-sensitive. Many of these components are sensitive to heat since the electronic and photonic behaviors of a diode, transistor, or light-emitting device are highly dependent upon temperature.

The integrated graphene film may be obtained from a graphene oxide gel or graphene oxide gel-bonded nano graphene platelets (NGPs). The graphene oxide gel may be advantageously prepared by heavily oxidizing graphite powder in a strong acid and/or oxidizer. NGPs may be obtained from exfoliation and separation of a graphite intercalation compound (GIC), or directly from "direct ultrasonication" of graphite without going through any oxidation or intercalation of graphite.

Graphite is made up of layer planes of hexagonal networks of carbon atoms. These layer planes of hexagonally arranged carbon atoms are substantially flat and are oriented or ordered so as to be substantially parallel and equidistant to one another. These layers of carbon atoms, commonly referred to as graphene layers or basal planes, are weakly bonded together in their thickness direction by weak van der Waals forces and groups of these graphene layers are arranged in crystallites. A highly ordered graphite material consists of crystallites of considerable size: the crystallites being highly aligned or oriented with respect to each other and having well ordered carbon layers. These anisotropic structures give rise to many properties that are highly directional, such as thermal and electrical conductivity.

The graphite structure is usually characterized in terms of two axes or directions: the "c" axis or direction and the "a" axes or directions. The "c" axis is the direction perpendicular to the basal planes. The "a" axes are the directions parallel to the basal planes (perpendicular to the "c" direction). The graphite suitable for manufacturing flexible graphite sheets is typically natural graphite flakes that possess a high degree of orientation.

Due to the weak van der Waals forces holding the parallel graphene layers, natural graphite can be treated so that the spacing between the graphene layers can be appreciably opened up so as to provide a marked expansion in the "c" direction, and thus form an expanded graphite structure in which the laminar character of the carbon layers is substantially retained. The process for manufacturing flexible graphite is well-known and the typical practice is described in U.S. Pat. No. 3,404,061 to Shane et al., the disclosure of which is incorporated herein by reference. In general, flakes of natural graphite are intercalated in an acid solution to produce graphite intercalation compounds (GICs). The GICs are washed, dried, and then exfoliated by exposure to a high temperature for a short period of time. This causes the flakes to expand or exfoliate in the "c" direction of the graphite up to 80-300 times of their original dimensions. The exfoliated graphite flakes are vermiform in appearance and, hence, are commonly referred to as worms. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite") having a typical density of about 0.04-2.0 g/cm³ for most applications.

The upper left portion of FIG. 1 shows a flow chart that illustrates the prior art processes used to fabricate flexible graphite and the resin-impregnated flexible graphite composite. The processes typically begin with intercalating graphite particles 20 (e.g., natural graphite or synthetic graphite flakes) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its "c" direction by a factor of 30 to several hundreds to obtain a worm-like vermicular structure, which contains exfoliated, but un-separated graphite flakes 24 with large pores interposed between these interconnected flakes.

In one prior art process, the exfoliated graphite is re-compressed by using a calendering or roll-pressing technique to obtain flexible graphite sheets or foils 26, which are typically much thicker than 100 μm. It seems that no flexible graphite sheet thinner than 75 μm has ever been reported in the open literature or patent documents. Commercially available flexible graphite sheets normally have a thickness greater than 0.125 mm (125 μm), an in-plane electrical conductivity of $1\text{-}3\times10^3$ S/cm, through-plane (thickness-direction) electrical conductivity of 15-30 S/cm, in-plane thermal conductivity of 140-450 W/(mK), and through-plane thermal conductivity of approximately 5 W/(mK). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength.

The exfoliated graphite may be subjected to high-intensity mechanical shearing/separation treatments using an air mill, ball mill, or ultrasonic device to produce separated nano-scaled graphene plates 34 (NGPs) with all the graphite platelets thinner than 100 nm, mostly thinner than 10 nm. An NGP is composed of a graphene sheet or a plurality of graphene sheets with each sheet being a two-dimensional, hexagonal carbon structure.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 μm, but can be larger than 200 μm.

In addition to graphene or NGPs, another ingredient of the presently invented composite thin film composition is graphene oxide (GO), which is obtained from a graphene oxide gel. This gel is obtained by immersing a graphitic material 20 in a powder or fibrous form in a strong oxidizing liquid in a reaction vessel to form an optically opaque suspension or slurry (an inhomogeneous mixture of solid and liquid ingredients). The reaction between graphite powder and the oxidizing agent is allowed to proceed at a reaction temperature for a length of time sufficient to transform this opaque suspension into a translucent or transparent solution, which is now a homogeneous fluid called "graphene oxide gel."

This graphene oxide gel is optically transparent or translucent and visually homogeneous with no discernible discrete graphene or graphene oxide sheets dispersed therein. It is essentially a homogeneous solution. In contrast, conventional suspension of discrete graphene sheets, graphene oxide sheets, and expanded graphite flakes look dark, black or heavy brown in color with individual graphene or graphene oxide sheets or expanded graphite flakes discernible or recognizable with naked eyes. These clearly identifiable flakes are suspended in a fluid when one shakes the container; however, these flakes are highly sedimentary and become a sedimentation settled at the bottom of the container soon after the shaking action is ceased.

The graphene oxide molecules dissolved in a graphene oxide gel are aromatic chains that have an average number of benzene rings in the chain typically less than 1000, more typically less than 500, and most typically less than 100. Most of the molecules have more than 5 or 6 benzene rings (mostly > 10 benzene rings) from combined atomic force microscopy, high-resolution TEM, and molecular weight measurements. Based on our elemental analysis, these benzene-ring type of aromatic molecules are heavily oxidized, containing a high concentration of functional groups, such as —COOH and —OH and, therefore, are "soluble" (not just dispersible) in polar solvents, such as water. The estimated molecular weight of these graphene oxide polymers in the gel state is typically between 200 g/mole and 43,000 g/mole, more typically between 400 g/mole and 21,500 g/mole, and most typically between 400 g/mole and 4,000 g/mole.

These soluble molecules behave like polymers and are surprisingly capable of serving as a binder or adhesive that bonds NGPs together to form a composite thin film of good structural integrity and high thermal conductivity. Conventional discrete graphene or graphene oxide sheets do not have any binding or adhesion power.

The graphene oxide gel can be cast onto a smooth surface (e.g. surface of a piece of glass) and transformed into a solid graphene oxide film by removing the liquid component of the gel. This solid film may be subjected to a heat treatment at a temperature in a range of 100-1,500° C. (up to 3,200° C. if so desired), more typically in the range of 300-1,000° C., and most preferably in the range of 300-700° C. Quite surprisingly, graphene oxide molecules appear to be capable of re-joining or merging with one another to become giant molecules of essentially infinite molecular weight. The resulting film has just one or a few graphene grains (per layer) that are reminiscent of the original graphene oxide sheets. In other words, thousands of discrete graphene oxide molecules (obtained through heavy oxidation of originally thousands of discrete graphite flakes) are now united or integrated into just a few giant graphene sheets.

The present invention provides a graphene composite thin film composition for use as a heat-dissipating layer in a display device. The graphene composite film is composed of nano graphene platelets (NGPs) bonded by a graphene oxide binder, wherein the NGPs contain single-layer graphene or multi-layer graphene sheets having a thickness from 0.335 nm to 100 nm, and the NGPs occupy a weight fraction of 1% to 99.9% of the total composite weight; and the graphene oxide binder (having an oxygen content of 1-40% by weight based on the total graphene oxide weight) occupies a weight fraction of 0.1% to 99% of the total composite weight, and wherein the composite forms a thin film with a thickness no greater than 1 mm, preferably less than 200 μm, further preferably less than 100 μm. More preferably, the thickness is greater than 10 μm, further preferably between 10 and 100 μm, and most preferably between 10 μm and 50 μm. A thickness less than 10 μM would make it impossible to handle the composite thin film when attempting to incorporate pieces of the composite thin film in a device for thermal management applications.

The multi-layer graphene sheets preferably have a thickness of 3.35 nm to 33.5 nm and the resulting composite film has a thickness no greater than 100 μm. When multi-layer graphene sheets have a thickness of 6.7 nm to 20 nm, one can readily produce a composite film having a thickness not greater than 50 μm.

The graphene oxide-bonded graphene composite thin film composition desirably contains pristine graphene containing no oxygen. The pristine graphene can be obtained from direct ultrasonication without involving oxidation of a graphitic material.

The graphene oxide (GO) binder has an oxygen content of 1-10% by weight based on the total graphene oxide weight. The GO binder, when in a gel state, typically has an oxygen content of 20-46% by weight. After combining with NGPs to form a composite thin film, the process naturally reduces the oxygen content to typically 1-10% by weight, more typically 1-5%, and most typically <2% by weight. With a high heat treatment temperature and/or long heat treatment time, 1 n oxygen content less than 1% has been obtained. However, it is important to have a GO gel having an oxygen content >20% by weight before combining this GO gel with NGPs or before this GO gel is heat treated to activate the merger and integration of GO molecules into a unitary entity composed of single or few graphene grains.

The graphene oxide binder occupies a weight fraction of 1% to 20% of the total composite weight. The graphene oxide is obtained from a graphene oxide gel, which gel is composed of graphene oxide molecules dispersed in an acidic medium having a pH value of no higher than 5 and the graphene oxide molecules have an oxygen content no less than 20% by weight. In particular, the gel is obtained by immersing a graphitic material in a powder or fibrous form in an oxidizing liquid in a reaction vessel at a reaction temperature for a length of time sufficient to obtain a graphene oxide gel composed of graphene oxide molecules dispersed in an acidic medium having a pH value of no higher than 5 and the graphene oxide molecules have an oxygen content no less than 20% by weight. The graphene composite is obtained by mixing the NGPs in the graphene oxide gel to form a NGP-graphene oxide mixture suspension, making the suspension into a thin film form, and removing the residual liquid from the mixture suspension.

The starting graphitic material for the purpose of forming graphene oxide gel may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The graphitic material is preferably in a powder or short filament form having a dimension lower than 20 µm, more preferably lower than 10 µm, further preferably smaller than 5 µm, and most preferably smaller than 1 µm.

Using artificial graphite with an average particle size of 9.7 µm as an example, a typical procedure involves dispersing graphite particles in an oxidizer mixture of sulfuric acid, nitric acid, and potassium permanganate (at a weight ratio of 3:1:0.05) at a temperature of typically 0-60° C. for typically at least 3 days, preferably 5 days, and more preferably 7 days or longer. The average molecular weight of the resulting graphene oxide molecules in a gel is approximately 20,000-40,000 g/mole if the treatment time is 3 days, <10,000 g/mole if 5 days, and <4,000 g/mole if longer than 7 days. The required gel formation time is dependent upon the particle size of the original graphitic material, a smaller size requiring a shorter time. It is of fundamental significance to note that if the critical gel formation time is not reached, the suspension of graphite powder and oxidizer (graphite particles dispersed in the oxidizer liquid) appears completely opaque, meaning that discrete graphite particles remain suspended (but not dissolved) in the liquid medium. As soon as this critical time is exceeded, the whole suspension becomes optically translucent or transparent, meaning that the heavily oxidized graphite completely lost its original graphite identity and the resulting graphene oxide molecules are completely dissolved in the oxidizer liquid, forming a homogeneous solution (no longer just a suspension or slurry).

It must be further noted that if the suspension or slurry, with a treatment time being shorter than the required gel formation time, is rinsed and dried, we would simply recover a graphite oxide powder or graphite intercalation compound (GIC) powder, which can be exfoliated and separated to produce nano graphene platelets (NGPs).

Hence, the NGPs may be produced by subjecting a graphitic material to a combined treatment of oxidation, exfoliation, and separation. This graphitic material may also be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The NGPs can also be produced from a process such as (a) direct ultrasonication, (b) potassium melt intercalation and water/alcohol-induced exfoliation, or (c) supercritical fluid intercalation/exfoliation/separation of non-oxidized graphitic material. These processes produce pristine graphene that contains no oxygen The graphene composite thin film composition typically has a thermal conductivity greater than 800 $Wm^{-1}K^{-1}$, more typically greater than 1,000 $Wm^{-1}K^{-1}$ (even when the film thickness is greater than 10 µm) and often greater than 1,700 $Wm^{-1}K^{-1}$. The composite thin film has an electrical conductivity greater than 3,000 S/cm. This high electrical conductivity (greater than 3000 S/cm) can be achieved concurrently with a thermal conductivity greater than 1,000 $Wm^{-1}K^{-1}$. Quite often, the composite thin film can exhibit a combination of a high electrical conductivity (greater than 1,500 S/cm), a high thermal conductivity (greater than 600 $Wm^{-1}K^{-1}$), a relatively high physical density (greater than 1.4 $g/cm^3$), and a relatively high tensile strength (greater than 10 MPa).

Quite surprisingly, in many samples, the composite thin film has an electrical conductivity greater than 2,000 S/cm, a thermal conductivity greater than 800 $Wm^{-1}K^{-1}$, a physical density greater than 1.8 $g/cm^3$, and a tensile strength greater than 40 MPa. This combination of superior properties has not been achieved with any graphite or non-graphite material. In some cases, the composite thin film has an electrical conductivity greater than 3,000 S/cm, a thermal conductivity greater than 1,500 $Wm^{-1}K^{-1}$, a physical density greater than 2.0 $g/cm^3$, and a tensile strength greater than 40 MPa. This type of graphene composite film may be used as a heat spreader component in a display device.

An embodiment of the heat spreader of the present invention is an integrated graphene film or GO-bonded NGP composite film, having two major surfaces. One of the major surfaces is sized to be positioned in operative contact with the display panel back so that the heat generated by the displaying cells can be dissipated into this heat spreader layer. Optionally, the area of the major surface which is in contact with the display panel may be greater than the back surface of the display device where a localized region of higher temperature is generated, so that the heat spreader layer can spread the heat from the heat source more effectively.

Due to the exceptionally high thermal conductivity of the integrated graphene film or GO-graphene composite film, localized heat in the displaying cell with high brightness can be transferred to other low temperature areas and avoid the occurrence of hot spots. At the same time, heat from the display cells is not allowed to transmit directly through the plane of the heat spreader layer from one of the major surfaces in operative contact with the heat source to the other. The Therefore, heat is essentially prevented from transmitting to a second component (which is heat sensitive).

Further, due to the flexible nature of the integrated graphene film, the heat spreader can conform to the contours of the components within a display device, thus not requiring very much additional space. In contrast, a more rigid material like copper or aluminum would not as easily be able to do the same. Furthermore, the ability to produce integrated graphene film into a thickness in the range of 10-60 μm (as opposed to flexible graphite sheets that are typically thicker than 125 μm), can help save lots of space. This is a critically important feature in view of the ever-increasing demand to further reduce the thickness and weight of large scale and portable displaying device.

We have further observed that flexible graphite (FG) sheets have some additional challenging issues when used as a heat spreader. The FG foil lacks mechanical integrity and, hence, difficult to handle. Furthermore, the FG foil has a great tendency to have graphite particles flaking from or even separated from the FG foil surface, emitting highly conducting graphite flakes into air and get settled on other components of a display device, creating internal shorting problems. In order to alleviate these problems, the FG supplier typically has to apply a protective coating to the surface of FG foil. We have found it unnecessary to implement protective coating onto a surface of our integrated graphene film for the purpose of improving the handleability and mechanical robustness of the heat spreader. There is also no flaking problem when handling our integrated graphene film. There are simply no graphite flakes contained in the presently invented graphene film. The integrated graphene film is distinct from the prior art flexible graphite sheets in terms of chemical composition, microstructure, morphology, production processes, and all properties. There is no similarity between the integrated graphene film and a flexible graphite sheet with the exception that both materials contain carbon as a major element.

Although the use of a protective coating or film is unnecessary for most of the practical applications, some electrically insulating coating or protective film may be used in those applications where a direct electric contact of the graphene film with a sensitive component (e.g. CPU) is undesirable. Protective coating can be selected from any electrically insulating polymer, such as epoxy, polyethylene, polyester or polyimide. Once an integrated graphene film is made, a protective coating can be applied by various commonly used coating methods, such as spray coating, roller coating, hot laminating press, mechanical mapping, and lamination.

A practical process for producing a graphene oxide-bonded graphene composite film includes: (a) preparing single-layer or multilayer graphene platelets from a graphitic material; (b) preparing a graphene oxide gel having graphene oxide molecules dispersed in an acidic fluid medium; (c) mixing the graphene platelets in the graphene oxide gel to form a composite gel; and (d) forming a composite gel into a composite thin film by removing the fluid medium.

The graphene platelets preferably are pristine graphene containing no oxygen. The pristine graphene is prepared from a graphitic material without involving oxidation of graphite.

As illustrated in FIG. 1, the graphene oxide gel is prepared by immersing a graphitic material in a powder or fibrous form in a strong oxidizing liquid in a reaction vessel at a reaction temperature for a length of time sufficient to obtain a graphene oxide gel composed of graphene oxide molecules dispersed in an acidic medium having a pH value of no higher than 5 and the graphene oxide molecules have an oxygen content no less than 20% by weight. Such a graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

The graphene platelets may be produced from a graphitic material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The starting material may be immersed in a mixture of sulfuric acid, nitric acid, and potassium permanganate to allow for intercalation of acid into interior of the graphitic, resulting in the formation of graphite intercalation compound (GIC) after rinsing and drying. The GIC is then exfoliated in a high temperature furnace to obtain exfoliated graphite, which is then subjected to mechanical shearing to obtain isolated NGPs.

For the preparation of graphene oxide gel-bonded graphene composite thin film, the discrete NGPs (preferably thinner than 20 nm, more preferably thinner than 10 nm) are dispersed in a graphene oxide gel to produce a suspension wherein discrete graphene platelets (NGPs) are suspended in the oxidizer mixture liquid 36 (FIG. 1), in which graphene oxide molecules are dissolved as well. The graphene platelet concentration is preferably lower than 50% by weight in the suspension (most preferably smaller than 20%). The suspension (or slurry) is allowed to form into thin film structures using techniques like solvent cast, vacuum-assisted filtration, spin coating, dip coating, or paper-making. Upon removal of the liquid medium, the resulting thin-film structures 40 contain discrete graphene platelets being dispersed in a polymer binder matrix (graphene oxide molecules). This thin-film structure is then subjected to a thermal treatment or re-graphitization treatment (typically 100-1000° C., but can be higher), which allows individual graphene oxide molecules to chemically bond to graphene sheets or platelets. This thermal treatment also surprisingly enables or activates the re-joining, polymerization, or chain-growth of otherwise small graphene oxide molecules, resulting in removal of non-carbon elements (e.g. H and O) and formation of large graphene sheets. The presence of discrete NGPs appears to provide "nucleation sites" to accelerate the growth of these huge graphene sheets. It appears that the original NGPs (discrete graphene platelets) and graphene oxide molecules can be merged and integrated into one unitary entity that exhibits an unprecedented combination of exceptional thermal conductivity, electrical conductivity, structural integrity (strength and ease of handling). These properties are unmatched by any graphitic or non-graphitic materials.

The thermal treatment process can be assisted with a calendering or roll-pressing operation to help improve the surface finish of the resulting thin film. The film thickness can be less than 10 μm, but preferably between 10 μm and 100 μm.

Thus, the present invention also provides a process for producing graphene-oxide-bonded pristine graphene composite 42 (FIG. 1), which involves mixing discrete NGPs in said graphene oxide gel to form a NGP-graphene oxide mixture suspension 38, making the suspension into a thin film form, removing a residual liquid from the mixture suspension, and subjecting the thin film 42 to a re-graphitization treatment at a temperature in the range of 100° C. and 3,200° C. The re-graphitization temperature is preferably in the range of 300° C. and 1,500° C. or in the range of 300° C. and 1,000° C. The thin film composition can form into a unitary structure after the re-graphitization treatment.

Figure 5:
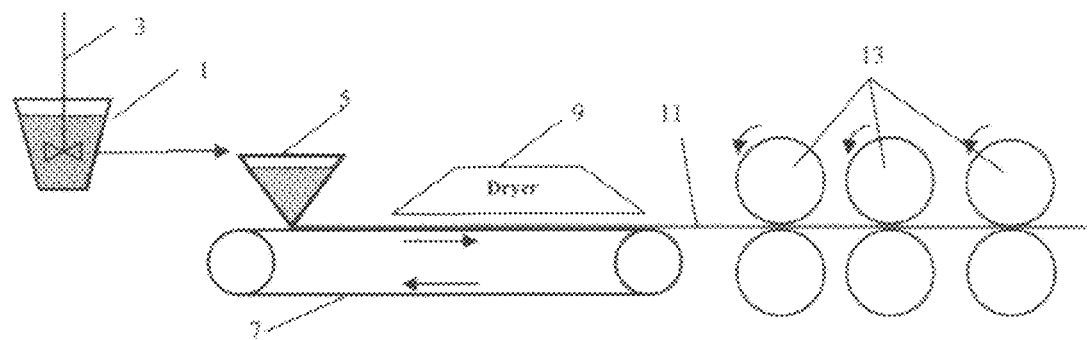
FIG. 5 A Schematic drawing of the process for the continuous production of thin graphene composite film.

The integrated graphene film of the present invention can be readily produced in large quantities. FIG. 5 shows a continuous process to prepare the inventive flexible graphene-graphene oxide composite sheet. The NGPs particles and graphene oxide gel are mixed in container 1 with a mechanical stirrer 3, and then transferred to a coating system. The NGP-graphene oxide gel mixture is then coated on the conveyor belt from container 5 and then dried by a blast dryer on the belt. As the paste move to the end of the conveyor belt, the coating is already dried. The power of the blast dryer can be adjusted according to the solid content and thickness of the coating as well as the speed of the conveyor belt. The dried coating film is peeled off the conveyor belt at the far end of the belt and is fed into a set of roller compressors 13. The coating film 11 was then compressed into a designed thickness and density as it goes though the rollers. The width of coating film is usually 0.5 to 1 meter but can be customized to larger dimensions for use in large area display panels.

As indicated above, flexible graphite sheets prepared by re-compression of exfoliated graphite or graphite worms exhibit relatively low thermal conductivity and mechanical strength. The graphite worms can be formed into flexible graphite sheets by compression, without the use of any binding material, presumably due to the mechanical interlocking between the voluminously expanded graphite flakes. Although a significant proportion of these flakes are oriented in a direction largely parallel to the opposing surfaces of a flexible graphite sheet (as evidenced by the high degree of anisotropy with respect to thermal and electrical conductivity), many other flakes are distorted, kinked, bent over, or oriented in a direction non-parallel to these sheet surfaces. This observation has been well demonstrated in many scanning electron micrographs (SEM) published in open or patent literature. Furthermore, the presence of a large number of graphite flakes implies a large amount of interface between flakes, resulting in very high contact resistance (both thermal and electrical resistance).

As a consequence, the electrical or thermal conductivity of the resulting flexible graphite sheets dramatically deviates from what would be expected of a perfect graphite single crystal or a graphene layer. For instance, the theoretical in-plane electrical conductivity and thermal conductivity of a graphene layer are predicted to be $1-5 \times 10^4$ S/cm and 3,000-5,000 W/(mK), respectively. However, the actual corresponding values for flexible graphite are $1-3 \times 10^3$ S/cm and 140-300 W/(mK), respectively; one order of magnitude lower than what could be achieved. By contrast, the corresponding values for the presently invented graphene-oxide bonded graphene composite films are $3.5-10 \times 10^3$ S/cm and 600-2,230 W/(mK), respectively.

Figure 6A:
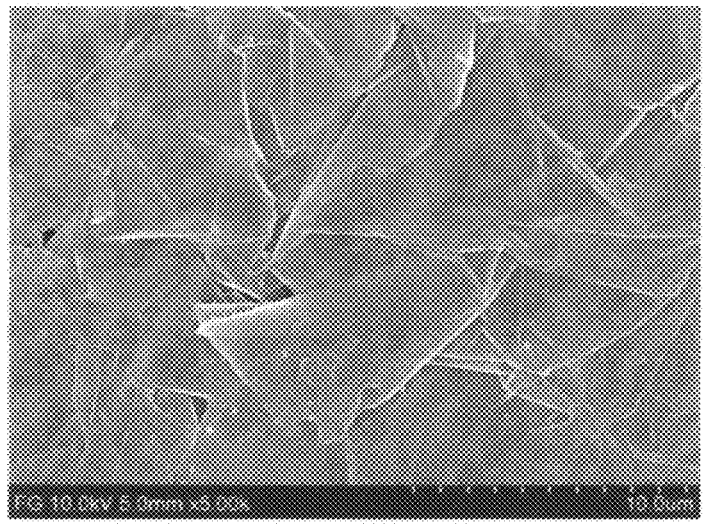
FIG. 6 SEM images of (A) the surface of the flexible graphite sheet made by re-compression of expanded graphite and (B) the surface of thin graphene composite film.
Figure 6B:
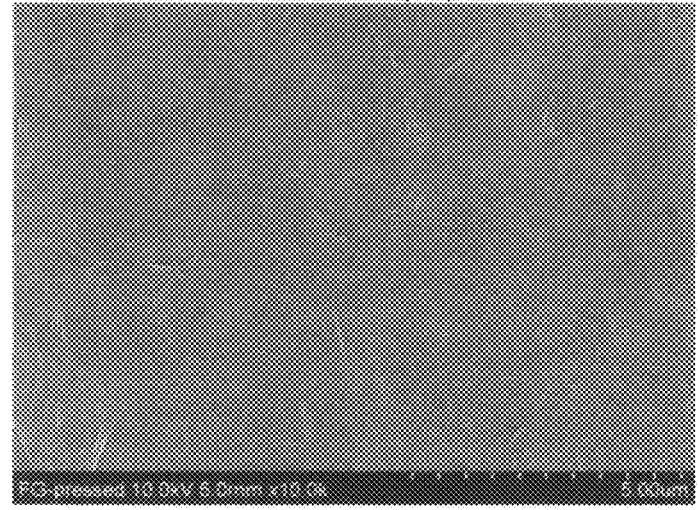

Referring to FIG. 6 (A), the surface finish of the flexible graphite sheet is very rough and the graphite particles are very easily peeled off from the sheet. The flaking of electrically conductive graphite particles may damage the display device by electrical shorting. In addition, the surface roughness of the flexible graphite sheet significantly reduces the real contact surface area with the display panel and thus increase the thermal interface resistance. As a result, the heat conducting efficiency is decreased. In contrast, as shown in FIG. 6(B), the surface of graphene composite film of the present invention is very smooth. The smooth surface helps to prevent the flaking of graphite particles and increase the thermal conducting efficiency. Actually, there are few grains in an integrated graphene film and there are no discrete graphite flakes present in the film, completely eliminating the flaking problem.

Display panels are now being produced at sizes of 1 meter and above (measured from corner to corner). Thus, heat spreaders used to cool and reduce the effects of hot spots on such panels are also required to be relatively large, on the order of about 270 mm×500 mm, or as large as about 800 mm×500 mm, or even larger. In a plasma display panel, as discussed above, thousands of cells, each containing a plasma gas component, are present. When a voltage is applied to each cell, the plasma gas reacts with phosphors in each cell to produce colored light. Since significant power is required to ionize the gas to produce the plasma, the plasma display can become very hot. Moreover, depending on the color in a particular region of the panel, hot spots can be created on the screen which can result in premature breakdown of the phosphors which can shorten display life as well as cause thermal stresses on the panel itself. Therefore, a heat spreader is needed to reduce the effect of these hot spots.

The integrated graphene composite film heat spreader of the present invention acts to reduce the heat difference between locations on the display device. In other words, the temperature difference between a hot spot on a plasma display panel, such as a location where a white image is created, and an adjacent location where a darker image is created, is reduced by the use of the inventive flexible graphene composite heat spreaders. Therefore, thermal stresses to which the plasma display panel would otherwise have been exposed are reduced, extending panel life and effectiveness. Moreover, since hot spots are reduced or eliminated, the entire unit can be operated at a higher temperature, resulting in a significant image quality improvement.

Figure 7:
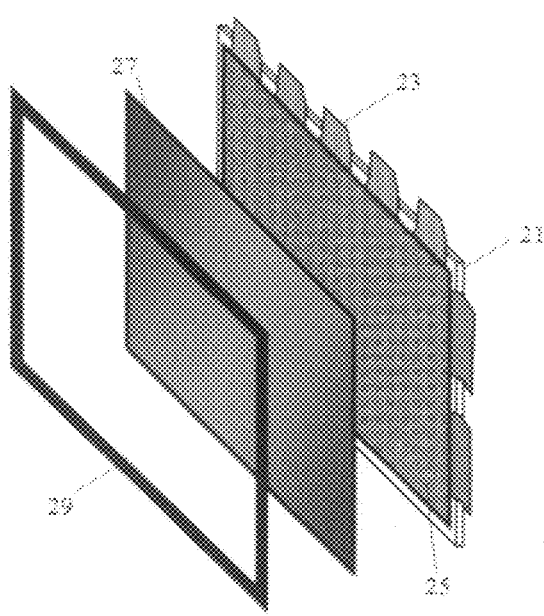
FIG. 7 Illustration of an assembly of a thin graphene composite film in a display device.

FIG. 7 shows an example of how a graphene heat spreader is implemented in a display device. The panel 25 of arrays of displaying cells is between the protective transparent glass 21 and the flexible graphene composite film 27. The dimension of graphene composite film is preferably larger than the panel 25 for a better heat dissipation effect. The flexible graphene composite film 27 is further fixed on the panel 25 by the frame 29 and separated from other electronic circuit components behind the frame 29.

In practice, it may be advantageous for the graphene heat spreaders to be produced with a layer of thermally conductive adhesive thereon to adhere the heat spreader to the plasma display panel, especially during the plasma display panel assembly process. In this situation, a release liner may be used to overlay the adhesive, with the adhesive sandwiched between the release liner and the graphene film, to permit storage and shipping of the graphene heat spreader prior to adhesion to the plasma display panel.

The use of an adhesive coated graphene sheet (or laminate of sheets) with a release liner has certain requirements which should be met if it is to be practical in a high volume display device manufacturing process. More particularly, the release liner must be capable of being removed from the sheet at a high speed without causing delamination of the constituent graphene films (NGPs). Delamination can occur when the release liner in effect pulls the adhesive and some of the NGPs off the film as it is being removed, resulting in a loss of NGPs, increased surface roughness of the graphene film itself, and diminution of adhesive needed to adhere the graphene film to the display device. These issues are significantly less severe as compared to the conventional flexible graphite sheets, but can still occur if the film is not handled properly.

Another factor to consider is the adhesion strength of the adhesive which should be sufficient to maintain the heat spreader in position on the display device during the manufacturing process and to maintain a good thermal contact between the heat spreader and the device.

The adhesive should not substantially interfere with the thermal performance of the heat spreader. In other words, the presence of the adhesive should not result in an increase in the through-thickness thermal resistance of the heat spreader of more than about 100% as compared to the heat spreader material itself, without adhesive. In a more preferred embodiment, the adhesive will not lead to an increase in the thermal resistance of more than about 30% as compared to the heat spreader material alone. Thus, the adhesive must meet the release load requirements and average lap shear adhesion strength requirement while being thin enough to avoid an undesirably large increase in thermal resistance. In order to do so, the adhesive should be no thicker than about 0.015 mm, more preferably no thicker than about 0.005 mm.

Although this application is written using the example of heat spreaders to plasma display panels, it will be recognized that the inventive method and heat spreader are equally applicable to other emissive display device heat sources, or heat source collections (equivalent in relevant function to the collection of individual discharge cells making up the plasma display panel) such as light emitting diodes, as well as other display devices which generate localized higher temperature regions or hot spots, such as liquid crystal displays.

EXAMPLE 1

Preparation of Nano Graphene Platelets (NGPs)

Chopped graphite fibers with an average diameter of 12 μm was used as a starting material, which was immersed in a mixture of concentrated sulfuric acid, nitric acid, and potassium permanganate (as the chemical intercalate and oxidizer) to prepare graphite intercalation compounds (GICs). The fiber segments were first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated graphite fibers were filtered and washed thoroughly with deionized water until the pH level of the solution reached 6. After being dried at 100° C. overnight, the resulting graphite intercalation compound (GIC) was subjected to a thermal shock at 1050° C. for 45 seconds in a tube furnace to form exfoliated graphite (worms). Five grams of the resulting exfoliated graphite (EG) were mixed with 2,000 ml alcohol solution consisting of alcohol and distilled water with a ratio of 65:35 for 12 hours to obtain a suspension. Then the mixture or suspension was subjected to ultrasonic irradiation with a power of 200 W for various times. After two hours of sonication, EG particles were effectively fragmented into thin NGPs. The suspension was then filtered and dried at 80° C. to remove residue solvents. The as-prepared NGPs have an average thickness of approximately 9.7 nm.

EXAMPLE 2

Preparation of Single-Layer Graphene from Meso-Carbon Micro-Beads (MCMBs)

Meso-carbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

EXAMPLE 3

Preparation of Pristine Graphene

In a typical procedure, five grams of graphite flakes, ground to approximately 20 μM or less in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours.

EXAMPLE 4

Preparation of Graphene Oxide Gel

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 μm) were immersed and dispersed in the oxidizer mixture liquid, the suspension or slurry appears optically opaque and dark. The suspension remains opaque during the first 52 hours of reaction. However, the suspension gradually turns optically translucent (a little cloudy) when the reaction time exceeds 52 hours, and the color of the suspension changes from black to dark brown. After 96 hours, the suspension suddenly becomes an optically transparent solution with light brown color. The solution appears very uniform in color and transparency, indicating the absence of any dispersed discrete objects. The whole solution behaves like a gel, very similar to a typical polymer gel.

Surprisingly, by casting this gel on a glass surface and removing the liquid medium from the cast film we obtain a thin film of graphene oxide that is optically transparent. This thin film looks like and behaves like a regular polymer film.

EXAMPLE 5

Preparation of Graphene Oxide Bonded Graphene Composite Thin-Film

The NGPs prepared in Examples 1-3 and the graphene oxide gels prepared in Example 4 were used for the preparation of graphene oxide-bonded graphene composite. Fully separated NGP platelets were dispersed in graphene oxide gel to produce a graphene platelet suspension with the platelet concentration of approximately 1-50% by weight (preferably 5-20% by weight NGP). Ultrasonic waves were employed to assist in the dispersion of NGPs in the gel. This NGP-gel suspension or slurry was then cast onto a glass surface and regulated by a doctor's blade to form a film of uniform thickness. The liquid in the film was then removed in a vacuum oven to form a solid composite film.

Some selected solid films were subjected to a heat treatment (re-graphitization treatment) at a temperature of 100-1,500° C. (in some cases, 1,500-2,800° C., for comparison purposes) for 2-4 hours. For comparison, we also carbonized polyimide films at 1000° C. for 3 hours in an inert atmosphere and then graphitized the films at a temperature in the range of 2,500-3,000° C. for 5 hours to form a conventional graphitic film. Flexible graphite sheets were also obtained from commercial sources as another baseline material.

Figure 3A:
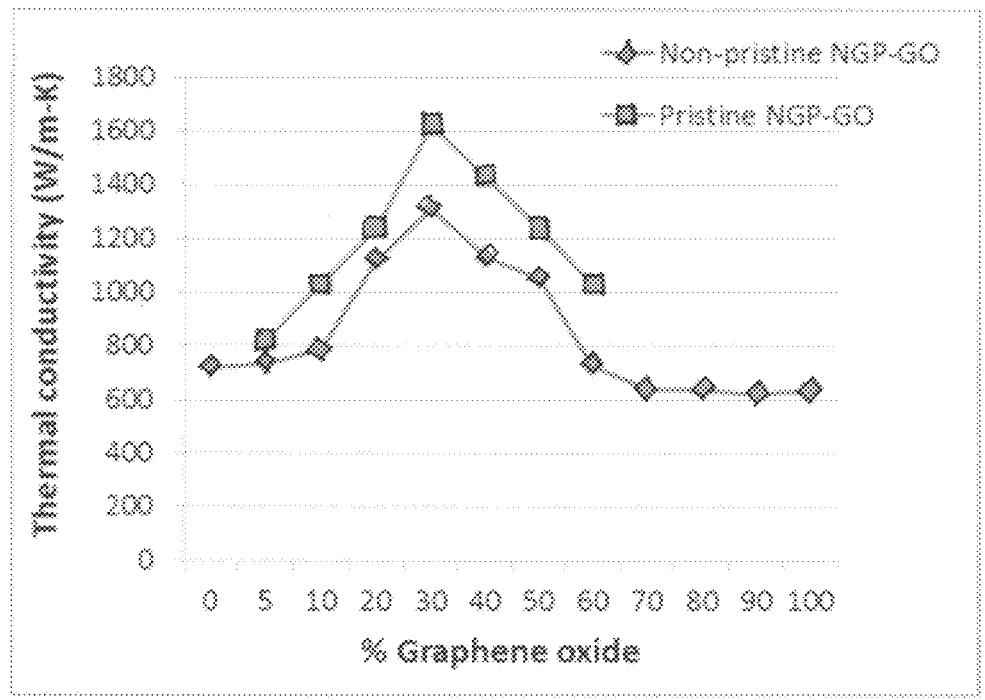
FIG. 3 (A) Thermal conductivity, (B) electrical conductivity, and (C) tensile strength of GO gel bonded NGP composites as a function of the GO content in the composite.

The in-plane thermal and electrical conductivities and tensile properties of various films were investigated. Several significant observations can be made from the testing results (e.g. as summarized in FIGS. 3(A), (B), (C) and FIG. 4):

(1) At a thickness of approximately 45 μm the thermal conductivity of the graphene oxide-bonded NGP composite films (heat treated at 800° C. for 2 hours) increases from 720 W/(mK) at 0% GO binder (containing graphene sheets only) to reach a maximum of 1310 W/(mK) at 30% GO, as shown in FIG. 3(A). The thermal conductivity value begins to decrease with a further increase in the GO binder amount. This maximum thermal conductivity is significantly higher than that (720 W/mK) of the thin film made up of NGPs only (0% GO) and that of the film containing GO only (100% GO). These data have clearly demonstrated an un-expected, synergistic effect between NGP (graphene) and GO (graphene oxide).

(2) These graphene-based composite thin films exhibit much higher thermal conductivity values than those (typically 140-300 W/(mK)) of commercially available flexible graphite sheets.

Figure 3B:
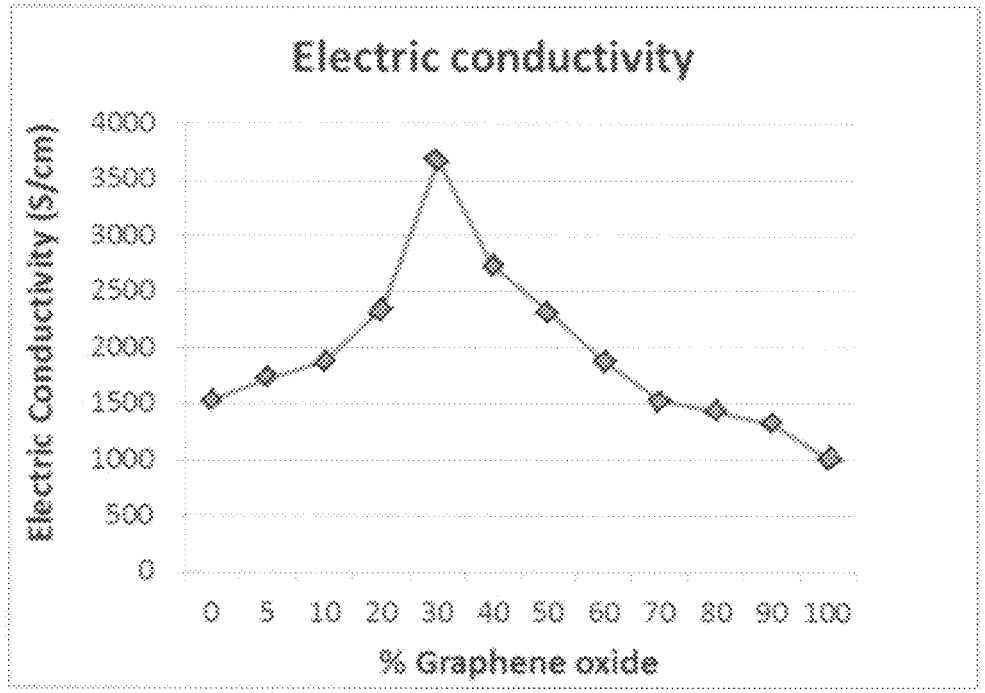
Figure 3C:
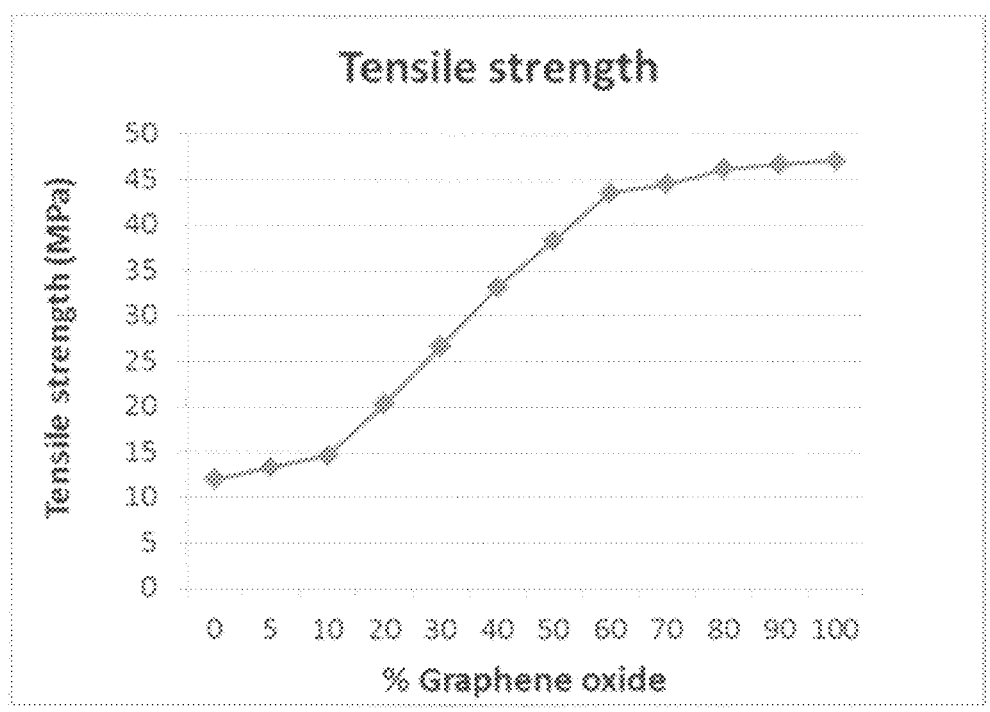

(3) FIG. 3(B) also shows a dramatic synergistic effect in electrical conductivity when graphene is combined with graphene oxide to form a composite material.

(4) Another unexpected observation is the notion that the tensile strength of the GO-NGP composite increases monotonically with the increasing GO content. This appears to suggest that GO gel has a strong adhering power capable of bonding graphene sheets or integrating with graphene sheets together, and that GO molecules in a GO gel are capable of combining with one another to form larger and stronger graphene/graphene oxide sheets that are relatively defect-free, leading to a relatively high mechanical strength.

(5) The presently invented GO-NGP composite and integrated GO can be readily produced into thin films much thinner than 100 μm (the practical lower limit of flexible graphite sheet thickness). Within the thickness range of 10-100 μm, the GO-NGP composite films exhibit an exceptionally high thermal conductivity of >1800 W/(mK) and the thermal conductivity is relatively independent of the film thickness (1820 W/mK at 24 μm, 1831 W/mK at 54 μm, and 1826 W/mK at 72 μm in thickness). It may be noted that NGPs alone (without GO gel as a binder), when packed into a film or paper sheet of non-woven aggregates, exhibit a thermal conductivity higher than 1,000 W/mK only when the film or paper is cast and pressed into a sheet having a thickness lower than 10 μm, and higher than 1,500 W/mK only when the film or paper is cast and pressed into a sheet having a thickness lower than 1 μm. This was reported in our earlier U.S. patent application Ser. No. 11/784,606 (Apr. 9, 2007). However, ultra-thin film or paper sheets (<10 μm) are difficult to produce in mass quantities, and difficult to handle when one tries to incorporate these thin films as a heat spreader material during the manufacturing of microelectronic devices. Further, thickness dependence of thermal conductivity (not being able to achieve a high thermal conductivity at a wide range of film thicknesses) is not a desirable feature.

(6) FIG. 3(A) also demonstrates that GO-bonded pristine graphene composite exhibits significantly higher thermal conductivity as compared to GO-bonded non-pristine NGP composites. The NGPs prepared from chemical oxidation or intercalation processes tend to have structural defects on graphene plane and have some non-carbon elements (e.g. oxygen and hydrogen). These NGPs are distinct from pristine NGPs (e.g. prepared from direct ultrasonication of graphite, alkali metal intercalation, and supercritical fluid extraction) in terms of chemical composition, microstructure, and properties).

Figure 4:
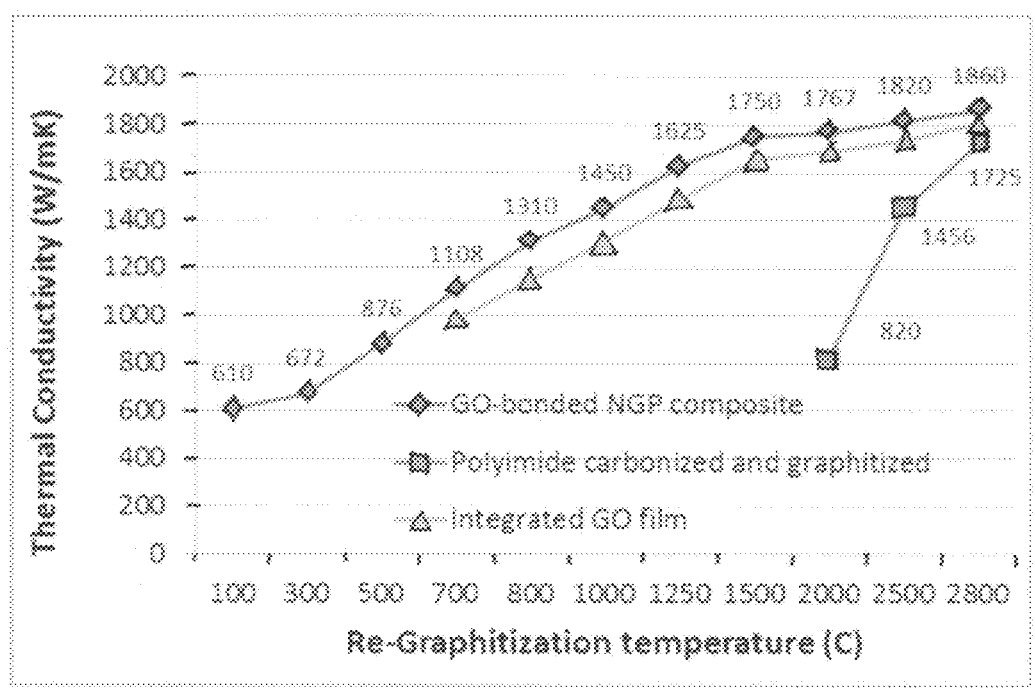
FIG. 4 Thermal conductivity values of GO gel bonded NGP composites, integrated graphene film from treated GO gel (heat treatment times 4 hours for GO and GO-NGP composite films), and polyimide-based graphitic films as a function of the heat treatment temperature (PI carbonization times of 3 hours followed by 5 hours of graphitization).

(7) As indicated in FIG. 4, the presently invented NGP-GO composite films and integrated GO films do not have to go through an ultra-high-temperature graphitization treatment. Graphitization of a carbonized resin (e.g. polyimide) or other carbon materials requires a temperature typically higher than 2,000° C., most typically higher than 2,500° C. The graphitization temperature is most typically in the range of 2,800-3,200° C. in order for carbonized materials or pyrolytic graphite to achieve a thermal conductivity >1,600 W/mK. In contrast, the typical heat treatment temperature (re-graphitization treatment) of the presently invented NGP-GO composites or integrated graphene film from GO is significantly lower than 1,500° C. and more typically lower than 1,000° (can be as low as 100° C.). For instance, carbonized polyimide, if graphitized at 2,000° C. for 5 hours, exhibits a thermal conductivity of 820 W/mK. In contrast, we were able to reach a thermal conductivity of 876 W/mK with a heat treatment of NGP-GO at 500° C. for 2-4 hours. This is very surprising and no one has ever thought that such a low graphitization temperature was possible. Clearly, this is a dramatically faster, less energy-intensive, and more cost-effective process.

(8) The integrated graphene films, without added NGPs, also outperform the pyrolytic graphite films graphitized from carbonized polymers by a huge margin. Again, a thermal conductivity as high as 983 W/mK was achieved with the integrated graphene film at a heat treatment temperature as low as 700° C. for 4 hours. The polyimide carbonized at 1,000° C. for 3 hours and graphitized at 2,000° C. for 5 hours only exhibits a thermal conductivity of 820 W/mK. This could not be and has not been anticipated by a person of ordinary skill in the art.

(9) In addition to the aforementioned quantitative data that has clearly demonstrated the stunning, superior performance of integrated graphene films and graphene-graphene oxide film, we have observed some very significant phenomenon that has been largely ignored or neglected. During this period of intensive and in-depth investigation of thermal management materials, we came to notice that flexible graphite sheets have a great tendency to become flaky and emit stray graphite flakes into the open air during handling (e.g. trying to get incorporated into an electronic device as a heat spreader). This not only creates undesirable air-borne particles that could be a health hazard, but also pose a shorting danger to the operation of an electronic device. These stray graphite flakes, being highly electrically conducting, can cause internal short-circuiting of sensitive devices. Our integrated films and GO-bonded NGP films do not have this issue.

EXAMPLE 6

Heat Dissipation Effect in a TV Display Panel

The thermal properties of a Panasonic plasma TV model number TH42PA20 using an acrylic thermal spreader attached to the back of the plasma display panel are analyzed under the following different screen conditions. Patterns of white and black are generated on the display and the screen surface temperatures measured using an infra-red camera. In all cases the background is black. Patterns consisted of: 1) three white lines evenly spaced horizontally across the screen (23.9% screen illumination) and; 2) a 4×3 array of evenly spaced white dots (4% screen illumination). After testing the unit with the flexible graphite sheet thermal spreader, the graphite sheet spreader is removed and replaced with a flexible graphene composite film thermal spreader 0.9 mm thick and having an in-plane thermal conductivity of approximately 860 W/m K. The plasma display is then re-tested under identical conditions as previously stated, and the results are summarized in Table 1.

TABLE 1

| Pattern | Thermal spreader | $T_{max}$ | Ambient |
|---|---|---|---|
| White line Pattern | Flexible graphite sheet | 48.7 | 23.5 |
| | Graphene composite film | 43.2 | 24.0 |
| White Dot Array Pattern | Flexible graphite sheet | 39.3 | 23.4 |
| | Graphene composite film | 31.2 | 23.2 |

EXAMPLE 7

Heat Dissipation Effect in Another TV Display Panel

The thermal properties of a NEC plasma display model Plasmasync 42" 42XM2 HD using an aluminum/silicone thermal spreader attached to the back of the plasma display panel are analyzed under the following different screen conditions. Patterns of white and black are generated on the display and the screen surface temperatures are measured using an infra-red camera. In all cases the background is black. Patterns consisted of: 1) three white lines evenly spaced horizontally across the screen (23.9% screen illumination) and; 2) a 4×3 array of evenly spaced white dots (4% screen illumination). After testing the unit with the conventional aluminum/silicone thermal spreader, the aluminum/silicone thermal spreader is removed and replaced with a flexible graphene composite thermal spreader 0.9 mm thick and having a thermal conductivity of approximately 860 W/m K. The display is then re-tested under identical conditions, and the results set out in Table 2.

TABLE 2

| Pattern | Thermal spreader | $T_{max}$ | Ambient |
|---|---|---|---|
| White line Pattern | Aluminum/silicone | 62.1 | 25.5 |
| | Graphene composite film | 46.2 | 25.7 |

These examples further illustrate the advantages using integrated graphene film-based heat spreader over conventional heat spreader technologies in terms of maximum temperature ($T_{max}$) observed.

In conclusion, we have successfully developed two new and novel classes of highly conducting graphene-based heat-spreading materials for display device thermal management applications: (1) integrated graphene film from graphene oxide gel; and (2) graphene oxide gel-bonded composites that contain non-pristine or pristine graphene sheets. The thermal and electrical conductivities and tensile strength exhibited by the presently invented materials are much higher than what prior art flexible graphite sheets or other graphitic films could achieve. The thermal and electrical conductivities exhibited by the presently invented materials are the highest of what graphite-type thin-layer materials (>10 µm) could achieve. The presently invented graphene film based heat spreaders have also demonstrated several advantages over prior art thermal management technologies that are highly significant and surprising.

We claim:

1. An integrated graphene film-enhanced display device, comprising:
   (a) a display device which comprises one or multiple heat sources and a back surface where a localized area is at a higher temperature than an adjacent area; and
   (b) a heat spreader which comprises at least one sheet of integrated graphene film having two major surfaces, wherein one of the major surfaces of the heat spreader is in thermal contact with one or multiple heat sources and further wherein the heat spreader itself reduces the temperature difference between two locations on the display device;
   wherein said integrated graphene film is composed of chemically merged graphene oxide gel molecules or graphene oxide gel-bonded nano graphene platelets (NGPs) that are merged in an edge-to-edge manner and exhibits a thermal conductivity of at least 600 W/mK, and said integrated graphene film has at least one of the following features:
   i) having an oxygen content of at least 0.1% by weight, but less than 10% by weight;
   ii) having a single grain, a single crystal, or few grains that has no or few sheet-to-sheet grain boundaries per layer; or
   iii) having an electrical conductivity greater than 2,000 S/cm, a physical density greater than 2.0 g/cm$^3$, or a tensile strength greater than 10 MPa.

2. The display device of claim 1 wherein the heat spreader comprises a laminate comprising a plurality of sheets of integrated graphene films.

3. The display device of claim 1, further comprising a heat dissipation device positioned in a location not directly adjacent to a heat source and wherein one of the major surfaces of the heat spreader is in operative contact with the heat dissipation device.

4. The display device of claim 3, wherein the heat dissipation device comprises a heat sink, a heat pipe, a heat plate, or a combination thereof.

5. The display device of claim 1, wherein the integrated graphene film has an in-plane thermal conductivity of at least 800 W/mK.

6. The display device of claim 1, wherein the integrated graphene film has an in-plane thermal conductivity of at least 1,500 W/mK.

7. The display device of claim 1, wherein the integrated graphene film further comprises a protective coating thereon.

8. The display device of claim 1, wherein the integrated graphene film further comprises a layer of adhesive applied thereon.

9. The display device of claim 1, wherein said integrated graphene film is a graphene composite film composed of nano graphene platelets (NGPs) bonded by a graphene oxide binder, wherein said NGPs contain single-layer graphene or multi-layer graphene sheets having a thickness from 0.335 nm to 100 nm, and said NGPs occupy a weight fraction of 1% to 99.9% of the total composite weight; and said graphene oxide binder, having an oxygen content of 0.1%-40% by weight based on the total graphene oxide weight, occupies a weight fraction of 0.1% to 99% of the total composite weight, and wherein said composite forms a thin film with a thickness no greater than 1 mm and no less than 1 μm.

10. The display device of claim 1, wherein said integrated graphene film has a thickness greater than 10 μm, but less than 100 μm.

11. The display device of claim 9, wherein said multi-layer graphene sheets have a thickness of 6.7 nm to 20 nm or said composite thin film has a thickness not greater than 50 μm.

12. The display device of claim 9, wherein said nano graphene platelets are pristine graphene containing no oxygen.

13. The display device of claim 9, wherein said nano graphene platelets are pristine graphene containing no oxygen and said pristine graphene is obtained from an oxidation-free procedure selected from direct ultrasonication, supercritical fluid intercalation, or alkali metal intercalation.

14. The display device of claim 9 wherein said graphene oxide binder has an oxygen content of 1-10% by weight based on the total graphene oxide weight which is measured after said graphene composite film composition is made.

15. The display device of claim 9 wherein said graphene oxide binder occupies a weight fraction of 1% to 40% of the total composite film weight.

16. The display device of claim 9 wherein said graphene oxide is obtained from a graphene oxide gel, in which said gel is composed of graphene oxide molecules dispersed in an acidic medium having a pH value of no higher than 5 and said graphene oxide molecules have an oxygen content no less than 20% by weight while in a gel state.

17. The display device of claim 9 wherein said graphene oxide is obtained from a graphene oxide gel, in which said gel is obtained by immersing a graphitic material in a powder or fibrous form in an oxidizing liquid medium in a reaction vessel at a reaction temperature for a length of time sufficient to obtain a graphene oxide gel composed of graphene oxide molecules dispersed in the liquid medium and said graphene oxide molecules have an oxygen content no less than 20% by weight and a molecular weight less than 43,000 g/mole while in a gel state.

18. The display device of claim 17 wherein said graphene oxide molecules have a molecular weight less than 4,000 g/mole.

19. The display device of claim 17 wherein said graphene oxide molecules have a molecular weight between 200 g/mole and 4,000 g/mole.

20. The display device of claim 17 wherein said graphene composite is obtained by mixing said NGPs in said graphene oxide gel to form a NGP-graphene oxide mixture suspension, making said suspension into a thin film form, and removing a residual liquid from said mixture suspension.

21. The display device of claim 17 wherein said graphene composite is obtained by mixing said NGPs in said graphene oxide gel to form a NGP-graphene oxide mixture suspension, making said suspension into a thin film form, removing a residual liquid from said mixture suspension to form a solid mixture, and subjecting said solid mixture to a re-graphitization treatment at a temperature in the range from 100° C. to 3,200° C.

22. The display device of claim 21 wherein said re-graphitization temperature is in the range from 300° C. to 1,500° C.

23. The display device of claim 21 wherein said re-graphitization temperature is in the range from 100° C. and 1,000° C.

24. The display device of claim 21 wherein said thin film composition forms into a unitary structure after said re-graphitization treatment.

25. The display device of claim 17 wherein said graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

26. The display device of claim 9 wherein said NGPs are produced from a graphitic material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

27. The display device of claim 9 wherein said integrated graphene film has an electrical conductivity greater than 3000 S/cm.

28. The display device of claim 9 wherein said integrated graphene film has an electrical conductivity greater than 3000 S/cm and a thermal conductivity greater than 1,000 $Wm^{-1}K^{-1}$.

29. The display device of claim 9 wherein said integrated graphene film has an electrical conductivity greater than 1,500 S/cm, a thermal conductivity greater than 600 $Wm^{-1}K^{-1}$, a physical density greater than 1.4 $g/cm^3$, and a tensile strength greater than 10 MPa.

30. The display device of claim 9 wherein said integrated graphene film has an electrical conductivity greater than 2,000 S/cm, a thermal conductivity greater than 800 $Wm^{-1}K^{-1}$, a physical density greater than 1.8 $g/cm^3$, and a tensile strength greater than 40 MPa.

31. The display device of claim 9 wherein said integrated graphene film has an electrical conductivity greater than 3,000 S/cm, a thermal conductivity greater than 1,500 $Wm^{-1}K^{-1}$, a physical density greater than 2.0 $g/cm^3$, and a tensile strength greater than 40 MPa.

32. The display device of claim 1 wherein said integrated graphene film is a film produced from a graphene oxide gel, which is prepared by immersing a graphitic material in a powder or fibrous form in an oxidizing liquid to form an optically opaque suspension in a reaction vessel at a reaction temperature for a length of time sufficient to obtain a graphene oxide gel that is optically transparent or translucent, wherein said graphene oxide gel is composed of graphene oxide molecules dispersed in an acidic medium having a pH value of no higher than 5 and said graphene oxide molecules have an oxygen content no less than 20% by weight.

33. The display device of claim 1 wherein said integrated graphene film is a film produced from a graphene oxide gel, which is prepared by immersing a graphitic material in an oxidizing agent to form an optically opaque suspension and allowing an oxidizing reaction to proceed until an optically transparent or translucent solution is formed, and wherein said graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

34. The display device of claim 1, wherein a thermal transfer material is positioned between the heat spreader and a heat source.

35. The display device of claim 34, wherein the thermal transfer material comprises a metal or a thermal interface material.

* * * * *